(12) United States Patent
Bakkers et al.

(10) Patent No.: US 7,633,081 B2
(45) Date of Patent: Dec. 15, 2009

(54) TUNABLE RADIATION EMITTING SEMICONDUCTOR DEVICE

(75) Inventors: Erik Petrus Antonius Maria Bakkers, Eindhoven (NL); Stefan Peter Grabowski, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 766 days.

(21) Appl. No.: 10/556,615

(22) PCT Filed: May 13, 2004

(86) PCT No.: PCT/IB2004/050671
§ 371 (c)(1),
(2), (4) Date: Nov. 15, 2005

(87) PCT Pub. No.: WO2004/102684
PCT Pub. Date: Nov. 25, 2004

(65) Prior Publication Data
US 2008/0192786 A1  Aug. 14, 2008

(30) Foreign Application Priority Data
May 19, 2003  (EP)  ................................. 03101399

(51) Int. Cl.
*H01L 29/06* (2006.01)

(52) U.S. Cl. ............................. 257/13; 257/14; 257/86; 257/103; 257/E33.008; 372/45.01; 372/46.01

(58) Field of Classification Search ................... 257/13, 257/E33.008
See application file for complete search history.

(56) References Cited

U.S. PATENT DOCUMENTS

| | | | |
|---|---|---|---|
| 5,920,078 A * | 7/1999 | Frey | 257/14 |
| 6,773,616 B1 * | 8/2004 | Chen et al. | 216/41 |
| 2002/0175408 A1 | 11/2002 | Majumdar et al. | |

* cited by examiner

*Primary Examiner*—Tu-Tu V Ho

(57) ABSTRACT

A tunable radiation emitting semiconductor device includes at least one elongated structure at least partially fabricated from one or more semiconductor materials exhibiting a bandgap characteristic including one or more energy transitions whose energies correspond to photon energies of light radiation. The structure is operable to emit light radiation in response to a current flow therethrough. Moreover, the elongated structure is fabricated to be sufficiently narrow for quantum confinement of charge carriers associated with the current flow to occur therein. Furthermore, the structure further includes an electrode arrangement for applying an electric field to the elongated structure for causing bending of its bandgap characteristic for modulating a wavelength of the light radiation emitted in operation from the structure in response to the current flow therethrough.

21 Claims, 5 Drawing Sheets

TUNABLE RADIATION EMITTING SEMICONDUCTOR DEVICE

The present invention relates to tunable radiation emitting semiconductor devices; in particular, but not exclusively, the invention relates to a tunable light emitting diode (LED). Moreover, the invention also relates to a method of fabricating such a tunable LED.

In the context of the present invention, light radiation is regarded as electromagnetic radiation including radiation visible to the human eye as well as infra red (IR) radiation having a free-space wavelength in the order of 1 μM as well as ultra violet (uv) radiation.

Light radiation emitting solid state devices such as light emitting diodes (LEDs) and solid state lasers are known. Such devices rely on semiconductor electron transitions having associated bandgap energies corresponding to quantum energies of light radiation photons emitted from the devices in operation. Solid state lasers are provided with optically resonant cavities, also known as optical etalons, to concentrate their emitted light radiation in a relatively small solid angle.

Bulk inorganic light-emitting devices, for example light emitting diodes (LEDs) fabricated from III-V semiconductors, are operable to emit radiation whose wavelength is determined by a bandgap of their associated semiconductor material. Thus, in order to obtain radiation at several substantially different wavelengths from a single solid state assembly, it is often necessary for the assembly to include several light emitting devices fabricated from mutually different bulk materials, the devices each arranged to output radiation at associated wavelengths. Such an assembly exhibits in use a characteristic that its output radiation is not continuously tunable over a range of wavelengths but is susceptible to being tuned stepwise in wavelength depending upon the number of different devices included in the assembly. Moreover, such an assembly is not susceptible to dynamically switching its output radiation wavelength extremely rapidly, for example 10 s of GHz frequencies, as desirable in contemporary and future envisaged telecommunications systems.

It is known from a published United States patent application no. US2002/0175408 that it is feasible to fabricate dimensional semiconductor nanostructures having uniform diameters of less than approximately 200 nm; such nanostructures are also known as "nanowires". These nanowires are susceptible to being fabricated as single-crystalline homostructures, and also as heterostructures comprising at least two single-crystalline materials having mutually different chemical compositions. On account of such heterostructures comprising single-crystalline materials, it is thereby feasible to fabricate monocrystalline heterostructures. Such nanowires are susceptible to having their doping and composition controlled in either their radial or longitudinal directions, thereby resulting in the nanowires comprising different materials. Monocrystalline nanowires fabricated according to methods described in the US patent are capable of emitting light radiation in a manner of single nanowire LEDs. Thus, arrays of these monocrystalline nanowires having mutually different compositions are susceptible to being employed to general light radiation whose wavelength is electronically discretely switchable in a range of radiation wavelengths by selectively energizing one or more nanowires in the array.

The inventors have appreciated that quantum confinement of charge carriers occurs in structures such as nanowires, quantum well devices and nanocrystals. Moreover, the inventors have appreciated that a degree of charge carrier confinement imposed on such structures is capable of causing bending in energy bands of these structures. Where these energy bands correspond to photon energies, light radiation is susceptible to being emitted. Thus, the inventors have appreciated that it is feasible to modify the wavelength of light radiation emitted from nanostructures whose energy-band energies correspond to photo energies of such radiation by arranging for bending of such energy bands to occur, for example by influence from an associated imposed electric field.

A first object of the present invention is to provide an alternative solid state light radiation source.

A second object of the invention is to provide such a solid state light radiation source which is continuously tunable.

A third object of the invention is to provide components, for example display devices, optical interrogation devices and optical telecommunication system components incorporating solid state light radiation sources which are continuously tunable.

According to a first aspect of the present invention, there is provided a tunable radiation emitting semiconductor device comprising at least one elongated structure at least partially fabricated from one or more semiconductor materials exhibiting a bandgap characteristic including one or more energy transitions whose energies correspond to photon energies of light radiation, the at least one structure thereby being operable to emit light radiation therefrom in response to a current flow therethrough, the at least one elongated structure being sufficiently narrow for quantum confinement of charge carriers associated with the current flow to occur therein, the at least one elongated structure further comprising an electrode arrangement for applying an electric field to the at least one elongated structure for causing bending of its bandgap characteristic for modulating a wavelength of the light radiation emitted in operation from the at least one structure in response to the current flow therethrough.

The invention is of advantage in that it is capable of providing a microfabricated tunable light source.

Preferably, the at least one elongated structure is encapsulated at least in a central region thereof in an insulating material, and the electrode arrangement is operable to cause bending of the bandgap structure of the at least one elongated structure by establishing the electric field through the insulating material. Use of such an insulating material for at least partially encapsulating the at least one elongated structure is of advantage in that a tuning electrode arrangement of the device is susceptible to being at least partially electrically insulated from a biasing arrangement for causing the current flow through the device.

Preferably, the at least one elongated structure comprises a plurality of regions of mutually different composition, the plurality of regions defining at least one semiconductor junction whereat carrier recombination associated with the current flow occurs in operation, said recombination operable to generate the light radiation for emission from the device. Carrier recombination at a semiconductor region is a convenient arrangement for generating photons whose quantum energies correspond to electron energy transitions at such a junction.

Preferably, in order to provide a more expansive region whereat light emission occurs and also provide the at least one elongated structure with a more convenient conduction characteristic for current passing therethrough, the at least one elongated structure includes therein a substantially intrinsic semiconductor region therein interposed between an n-type region and a p-type region, the intrinsic region being operable to support carrier recombination therein.

Preferably, the electrode arrangement is arranged to cover a region whereat the at least one semiconductor junction is substantially located. Such an arrangement is effective for ensuring that the electrode arrangement efficiently establishes an electric field capable of modulating the wavelength of light emission from the at least one semiconductor junction.

Alternatively, or additionally, the electrode arrangement is preferably arranged to lie adjacently to a region whereat the at least one semiconductor junction is substantially located. Such an arrangement ensures that light is less attenuated when emitted from one or more semiconductor junctions of the device.

Preferably, for each of the at least one elongated structures, the electrode arrangement provides a plurality of electrodes for differentially applying electric fields to the plurality of regions for causing mutually different energy band bending therein. Such an arrangement is capable of making the device have a narrower spectral bandwidth for light emission therefrom.

Preferably, the electrode arrangement is disposed so as to generate an electric field substantially in a direction orthogonal to a direction of the current flow along the at least one elongated structure. Such a configuration is capable of rendering the device convenient to manufacture and efficient to modulate the wavelength of light emitted from the device in operation.

Preferably, for obtaining satisfactory electron confinement to render the device operable, the at least one elongated structure has an effective nominal diameter which is in a range from 5 nm to 50 nm. More preferably, for obtaining improved light wavelength control, the at least one elongated structure has an effective nominal diameter which is in a range from 20 nm to 40 nm. Most preferably, the at least one elongated structure has an effective nominal diameter which is substantially 30 nm. Worded differently, the at least one elongated structure has a cross-sectional size such that quantum confinement of carriers therein may arise in operation.

Preferably, in order to render the device easier to manufacture and operate more efficiently for converting electrical energy to corresponding light energy, the at least one elongated structure has a length in a range from 100 nm to 50 µm. More preferably, the at least one elongated structure has a length in a range from 200 nm to 10 µm.

Preferably, in order to obtain adequate electron confinement in two dimensions, the at least one elongated structure has a cross-sectional aspect ratio not exceeding 1:2.

Preferably, when manufacturing the device, the at least one elongated structure is fabricated from group III-V or group II-VI compounds, or ternary or quaternary semiconductor materials. More preferably, such compounds or materials include at least one of Indium Phosphide, Gallium Arsenide, Indium Nitride, Cadmium Sulphide, Cadmium Selenide, Zinc Selenide, Indium Arsenide and Gallium Nitride. Such materials are susceptible to being photoelectrically active and are compatible with semiconductor microfabrication processes.

Preferably, in order to achieve a spatially compact device, the device comprises an array of said elongated structures, said elongated structures being disposed such that their elongated axes are substantially mutually parallel.

Preferably, in order to provide a useful overall flux of light radiation from the device for practical use in one or more domestic, industrial and telecommunications types of equipment, the device comprises a plurality of the elongated structures, said elongated structures being operable to emit their light collectively to provide a summated light output from the device.

Preferably, the device comprising a plurality of the elongated structures disposed as a 2-dimensional array of pixels for providing an image display. Preferably, for example, the device is adapted for use in at least one compact disc (CD) drive, DVD drive, pixel display and in optical components for use in optical communication systems.

According to a second aspect of the invention, there is provided a method of fabricating a tunable radiation emitting semiconductor device, the method comprising the steps of:

(a) providing a substantially planar substrate;
(b) forming a first layer of insulating material onto at least a region of the substrate;
(c) forming at least one elongated structure including at least one semiconductor junction on an exposed surface of the first layer remote from the substrate, the at least one structure being sufficiently small in cross-section to provide quantum confinement of charge carriers therein and providing sites for charge carrier recombination therein, such sites exhibiting an energy band distribution corresponding to quantum energies associated with light radiation, the at least one elongated structure being capable of conducting an associated current therealong;
(d) forming a second layer of insulating material at least partially covering the at least one elongated structure; and
(e) forming an electrode arrangement onto an upper exposed surface of the second layer of insulating material, the electrode arrangement being disposed so as to be capable of inducing energy band bending in the at least one elongated structure when biased in operation for modulating the wavelength of the light radiation emitted therefrom.

The method provides a convenient approach to fabricating devices according to the first aspect of the present invention.

Preferably, the electrode arrangement is arranged to cover a region whereat the at least one semiconductor junction is substantially located. Alternatively, the electrode arrangement is arranged to lie adjacent to a region whereat the at least one semiconductor junction is substantially located.

Preferably, for fabricating a device with narrower output light spectral bandwidth, the method is arranged to provide, for each of the at least one elongated structures, the electrode arrangement including a plurality of electrodes for differentially applying electric fields to the plurality of regions for causing mutually different energy band bending therein.

Preferably, the electrode arrangement is disposed so as to be capable of generating an electric field substantially in a direction orthogonal to a direction of the current flow along the at least one elongated structure.

Preferably, the at least one elongated structure has an effective nominal diameter which is in a range from 5 nm to 50 nm. More preferably, the at least one elongated structure has an effective nominal diameter which is in a range from 20 nm to 40 nm. Most preferably, the at least one elongated structure has an effective nominal diameter which is substantially 30 nm.

Preferably, when applying the method, the at least one elongated structure has a cross-sectional size such that quantum confinement of carriers therein is capable of arising in operation.

Preferably, the at least one elongated structure has a length in a range from 100 nm to 50 µm. More preferably, the at least one elongated structure has a length in a range from 200 nm to 10 µm.

Preferably, when applying the method, the at least one elongated structure has a cross-sectional aspect ratio not exceeding 1:2.

When applying the method, the at least one elongated structure is preferably fabricated from group III-V or group II-VI compounds, or ternary or quaternary semiconductor materials. More preferably, such compounds or materials include at least one of Indium Phosphide, Gallium Arsenide, Indium Nitride, Cadmium Sulphide, Cadmium Selenide, Zinc Selenide, Indium Arsenide and Gallium Nitride. Such a range of materials is desirable for rendering the device capable of emitting radiation in operation at different regions of the light spectrum.

Preferably, the method is arranged to fabricate the device to comprise an array of said elongated structures, said elongated structures being disposed such that their elongated axes are substantially mutually parallel.

Preferably, the method is arranged to fabricate the device to comprise a plurality of the elongated structures, said elongated structures being operable to emit their light collectively to provide a summated light output from the device.

Preferably, the method is arranged to fabricate the device to comprise a plurality of the elongated structures disposed as a 2-dimensional array of pixels for providing an image display.

It will be appreciated that features of the invention can be combined in any combination without departing from the scope of the invention.

Embodiments of the invention will now be described, by way of example only, with reference to the following drawings wherein.

In the following, light emitting diodes (LED) according to the invention will be described. However, it will be appreciated that other classes of devices are feasible utilizing electro-optical structures employed in such LEDs, for example tunable solid state lasers and tunable optical detectors. Moreover, it will be appreciated that such LEDs are susceptible to being fabricated into 2-dimensional arrays for producing visual display devices, for example pixel display devices.

Radiation emitted from standard bulk LEDs is determined by a bandgap of one or more materials incorporated therein. Thus, in a standard bulk LED, it is necessary to change its material and/or structure in order to generate light of a different wavelength therefrom; for example, light of mutually different wavelengths are susceptible to being conventionally generated from III-V semiconductor materials such as Gallium Aluminium Phosphide (GaAlP) and Indium Gallium Aluminium Phosphide (InGaAlP). However, more recently, attention has focused Indium Gallium Nitride (InGaN) which is capable of emitting light radiation at blue/ultraviolet radiation wavelengths; such blue/ultraviolet radiation is capable of exciting phosphors, for example YAG phosphors, to generate a range of mutually different colored radiation.

Figure 1:
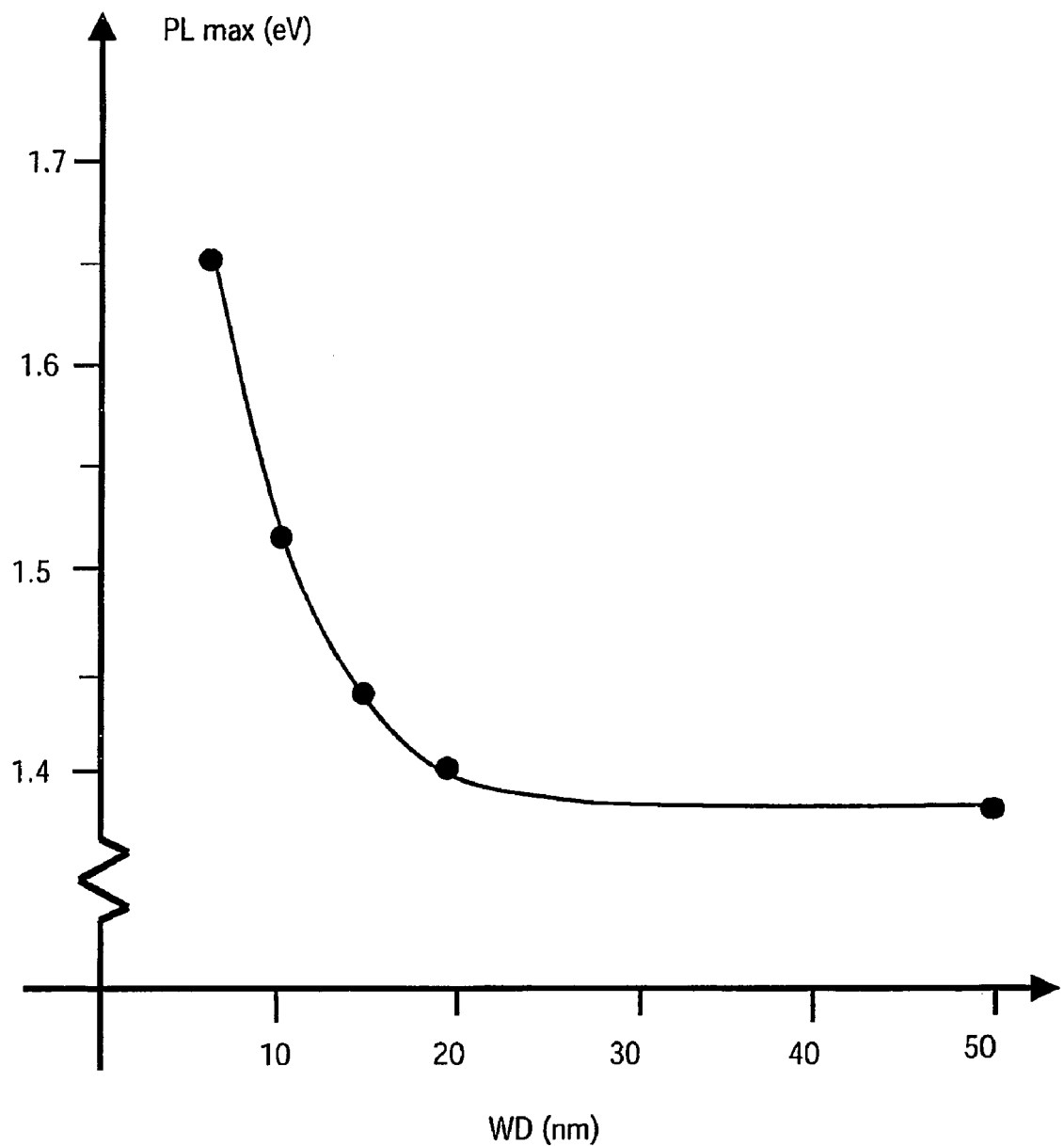
FIG. 1 is a graph comprising an abscissa axis and an ordinate axis corresponding to nanowire diameter and corresponding photoluminescence maximum energy (eV) respectively.

Another approach to providing a solid state semiconductor device capable of providing a variable-wavelength light output is to utilize quantum confinement which occurs in quantum wells, nanocrystals and nanowires. The inventors have appreciated that it is feasible to fabricate tunable semiconductor light sources by using such quantum wells, nanocrystals and/or nanowires. For example, a publication by Guzelian et al. in Applied Physics Letters 69 (1996) pp. 1432 identified by the inventors discloses that it is possible to decrease the wavelength of radiation emitted from a quantum well by decreasing the width of the quantum well, for example by decreasing its associated nanocrystal particle size. In particular, in the case of nanowires as described in Gudiksen et al. in Journal of Physical Chemistry B 106 (2002) pp. 4036, the inventors have appreciated that a photoluminescence maximum of Indium Phosphide (InP) nanowires is a function of the diameter of such nanowires; this observation has inspired the inventors to appreciate that, on account of nanowires being capable of emitting light radiation, the wavelength of such radiation is susceptible to being modulated by varying an effective diameter of such nanowires. An example of such a relationship between nanowire diameter and wavelength of light radiation emitted therefrom is provided in FIG. 1, wherein an abscissa axis denoted by "WD" relates to nanowire diameter and an ordinate axis denoted by "PL max" denotes maximum photoluminescence energy; as generally known, the photoluminescence energy can be related to light radiation output by way of Plank's constant, h. It will be appreciated that the wavelength of radiation generated by a nanowire changes significantly with respect to its diameter when the nanowire has a diameter of less than substantially 20 nm. However, it is difficult in practice to fabricate such nanowires, especially when their diameters are substantially less than 50 nm. Contemporary semiconductor integrated circuit production facilities are capable of photolithographically defining semiconductor devices, for example using deep-UV photolithography in combination with high contrast resists and dry etching procedures, to a minimum feature size in the order of 150 nm, hence wire diameters approaching 10 nm as provided in FIG. 1 are not feasible to manufacture conveniently using presently available semiconductor fabrication equipment.

The inventors have however appreciated that an electric field can be applied to reduce the effective diameter of nanowires to a degree that such a field can be employed to modulate the wavelength of light energy emitted from such nanowires.

The inventors have therefore devised a light emitting diode (LED) whose semiconductor material is disposed in the form of one or more nanowires having spatially associated therewith electrode arrangements for applying a controllable electrical field to the one or more nanowires.

In order to function, each nanowire comprises a pn-junction and an electrically-insulating oxide layer around it. Moreover, each nanowire is fabricated on a substrate, for example for cooling purposes. When there are several nanowires, they are preferably disposed on a substrate with their elongated axes mutually substantially parallel. Ends of the one or more nanowires are exposed through their oxide layer for making electrical contact thereto by way of vacuum-evaporated or sputtered metal end electrodes. Thus, a voltage difference applied to the end electrodes results in current flowing through their one or more nanowires causing them to emit optical radiation.

Onto the oxide layer in a region substantially spatially adjacent to the one or more nanowire junctions is included a metallic control electrode. The control electrode is arranged such that a potential difference applied between the control electrode and the substrate is operable to generate a nominally transverse electric field substantially at the one or more nanowire junctions causing depletion at it and thereby resulting in an effectively smaller active conduction diameter at it; charge transport and carrier recombination at the one or more junctions are thereby influenced as a consequence of band bending as occurs in conventional field effect transistors. If the effective diameter of the one or more nanowires is in a range where quantum confinement of carriers occurs therein, such confinement has a pronounced effect on the wavelength of radiation emitted from the one or more nanowires. Thus, by modulating a potential difference applied between the control electrode and the substrate, it is feasible to modulate a wavelength of light emitted in operation from the one or more junctions.

In FIG. 1, increasing depletion of the one or more nanowires in response to increasing potential difference between the control electrode and the substrate results in the effective diameter WD of the one or more nanowires decreasing. Such decrease in effective diameter WD corresponds to a photoluminescence shift wherein the one or more wires emit light radiation increasingly towards a blue end of the electromagnetic radiation spectrum. Thus, it is feasible using one or more semiconductor nanowires to fabricate a solid state light source whose output emitted radiation is of a wavelength which is continuously variable in response to a potential difference applied between the control electrode and the substrate.

In order to further describe the invention, examples of tunable radiation emitting semiconductor devices will be described with reference to FIGS. 2 to 4.

Figure 2:
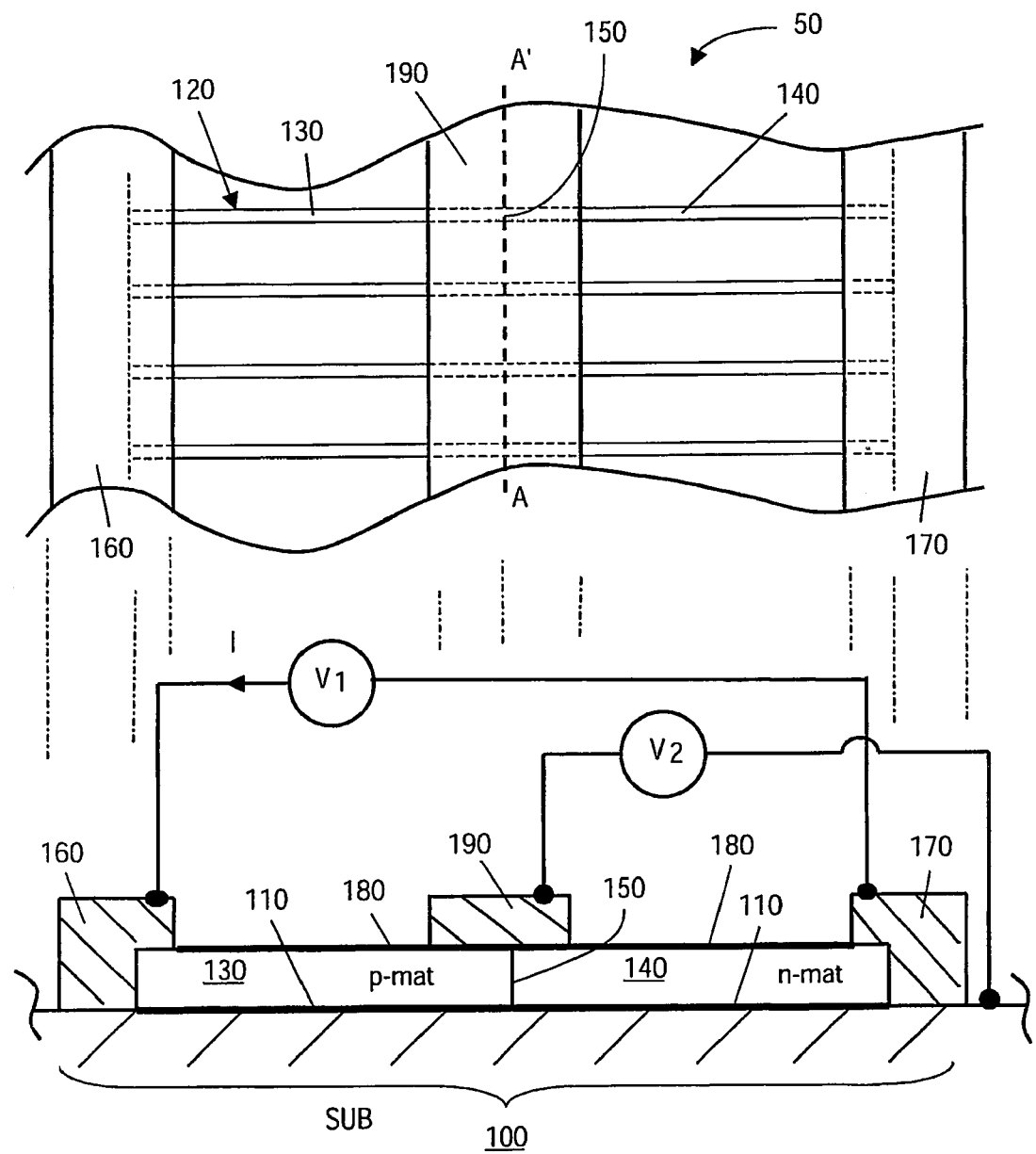
FIG. 2 is a schematic diagram of a first tunable radiation emitting semiconductor device according to the invention.

In FIG. 2, there is illustrated a first embodiment of a tunable radiation emitting semiconductor device according to the invention. The device is indicated generally by 50 and comprises a substrate (SUB) 100 on which is deposited or grown a lower oxide layer 110. On the oxide layer 110 remote from the substrate 100 is deposited an array of nanowires, for example a nanowire indicated by 120. Preferably, the nanowires 120 are one or more of substantially parallel and substantially mutually equidistantly spaced nanowires on the lower oxide layer 110. The nanowires 120 are mutually substantially identical, each nanowire 120 comprising a first nanowire segment 130 and a second nanowire segment 140, as illustrated. The segments 130, 140 are fabricated from p-type and n-type semiconductor materials respectively. Preferably, where the device 50 is operable to emit radiation lying within a part of the electromagnetic spectrum visible to the human eye, direct bandgap semiconductors are employed to fabricate the nanowires 120; such direct bandgap semiconductors include, but are not limited to, at least one of Indium Phosphide (InP), (Gallium Arsenide (GaAs), Indium Nitride (InN), Cadmium Sulphide (CdS), Cadmium Selenide (CdSe) and Zinc Selenide (ZnSe). Moreover, the nanowires 120 are susceptible to being fabricated by one or more of chemical vapour phase deposition, molecular beam epitaxy and related types of processes; more preferably, the nanowires 120 are fabricated by using a vapour-liquid-solid (VLS) growth process. When the device 50 is operable to emit electromagnetic radiation lying substantially at the infrared part and ultraviolet regions of the electromagnetic spectrum, the nanowires 120 are preferably fabricated from Indium Arsenide (InAs) and Gallium Nitride (GaN) respectively. Selective use of doping is employed to define the segments 130, 140, for example by way of ion implantation and/or control of vapour phase deposition processes used to fabricate the device 50.

The nanowires 120 preferably have a nominal diameter in a range from 10 nm to 50 nm, more preferably in a range from 20 nm to 40 nm, and most preferably substantially 30 nm. Moreover, the nanowires 120 preferably have a length in a range from 100 nm to 50 µm, and more preferably in a range from 200 nm to 10 µm. Furthermore, the nanowires 120 are preferably fabricated to have a cross-sectional aspect ratio substantially not exceeding 1:2. The nanowires 120 are preferably of a cross-sectional size such that quantum confinement is capable of occurring therein in operation.

Figure 5:
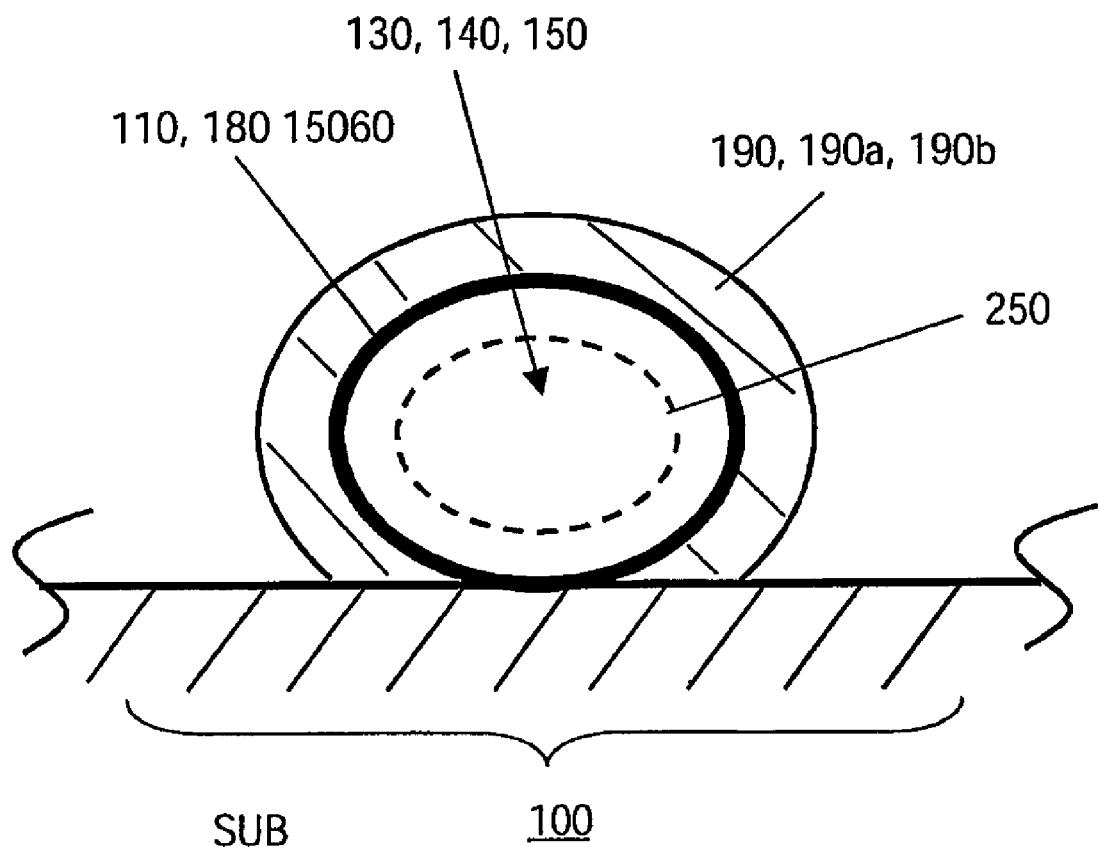
FIG. 5 is a cross-sectional illustrative example of a nanowire fabricated onto a substrate wherein an electric field applied to the nanowire is capable of modulating a conduction region within the nanowire and thereby intentionally bending energy-bands exhibited by the nanowire.

At a central axis A-A', the nanowire segments 130, 140 of each nanowire 120 meet to provide an associated semiconductor junction there 150. Ends of the nanowire segments 130, 140 remote from the central axis A-A' are exposed, for example by etching through the oxide layer 180, for making electrical contact thereto by way of end metal electrodes 160, 170 respectively as illustrated. Deposited on the nanowires 120 is an upper oxide layer 180 which is spatially arranged, in combination with the lower oxide layer 110, to enclose the nanowires 120 except where their segments 130, 140 make ohmic electric contact to the end metal electrodes 160, 170 respectively; such an arrangement is illustrated schematically in FIG. 5. Subsequently, a central metallic electrode 190 is deposited, for example by way of vacuum evaporation of metal, on the upper oxide layer 180 above the junctions 150 and the substrate 100 so as to be electrically insulated therefrom. Preferably, the central electrode 190 is elongated and arranged so that its elongated axis lies substantially parallel to the end metallic electrodes 160, 170 as illustrated; more preferably, the elongated axis of the central electrode is substantially orthogonal to longitudinal axes of the nanowires 120. In plan view, the central electrode 190 is arranged to overlap substantially symmetrically with the junctions 150 of the nanowires 120.

Operation of the device 50 will now be described in overview.

In operation, a first bias potential $V_1$ is applied across the electrodes 160, 170 to cause a current I to flow through the nanowires 120. A second bias potential $V_2$ is applied between the central electrode 190 and the substrate 100 to induce interface charges at an interface between the upper oxide layer 180 and the nanowires 120, such induced interface charges arising in a similar manner to gate charges in a field effect transistor (FET). The induced charges are capable of causing energy band bending in the nanowires 120, the amount of band bending being a function of the magnitude and polarity of the potential $V_2$. The potential $V_2$ is beneficially of a polarity such that a depletion layer is formed at the interface; the depletion layer is susceptible to being depleted of mobile carriers and, thus, an active conduction region of the nanowires 120 where charge transport and recombination takes place is capable of being reduced in size. The potential $V_2$ is hence operable to modulate an effective diameter of the nanowires 120 and therefore the wavelength of radiation emitted therefrom.

The junctions 150 are thus operable to emit light radiation in response to the current I flowing therethrough. Moreover, the potential $V_2$ is capable of modulating the wavelength of light radiation emitted from the junctions 150 in a continuously variable manner. As a result, the device 50 is capable of providing frequency-modulated optical radiation, for example for use in wavelength division multiplexed (WDM) optical communications apparatus.

Operation of the device 50 will now be further described in more detail.

In practice, the potential $V_2$ induces a different degree of band bending in differently doped parts of the nanowires 120.

For example, when the potential $V_2$ is made positive relative to the substrate 100, a positive charge is induced on an oxide side of the interface between the nanowires 120 and the upper oxide layer 180. In order to retain charge neutrality, a negative charge is required at the nanowires 120. At the interface in a region of the upper oxide layer 180 where it overlaps the first nanowire segment 130, an upward energy band bending will occur, namely a depletion or inversion layer will arise resulting in a negative space charge there. Conversely, at the interface in a region of the upper oxide layer 180 where it overlaps the second nanowire segment 140, a downward energy band bending occurs resulting in the formation of an accumulation layer. The band bending occurring in the vicinity of the second nanowire segment 140 is much smaller than the bending occurring in the vicinity of the first segment 130.

Thus, in the n-type semiconductor material of the second segment 140, an amount of negative charge necessary to compensate a positive charge induced by a signal applied to the central electrode 190 is small in comparison to a quantity of negative charge carriers which are already present in the n-type region; thus, a small degree of band bending will arise in practice. However, in the p-type semiconductor material of the first segment 130, relatively large number of negative charges are induced in comparison to a number normally present, for example as a consequence of doping impurities, hence a relatively large amount of band bending occurs in the first segment 130. Such relative differences in energy band bending arising in the two segments 130, 140 imply different diameters of active regions within the nanowires 120, thereby giving rise to a range of wavelengths for light radiation emitted from the nanowires 120.

In practice, differences in the amount of relative band bending occurring in the first and second wire segments 130, 140 has relatively minor effect in practice on account of the different mobilities of electrons and holes in the nanowires 120. Electrons in the nanowires 120 have a relatively higher mobility than holes therein, so that electrons penetrate deeper into the first wire segments 130 than holes into the second wire segments 140. Thus, recombination primarily spatially occurs in the first wire segment 130 fabricated from p-type material; consequently, band bending and hence wavelength modulation of light emitted from the device 50 is susceptible to being tuned in practice by applying a positive voltage to the central electrode 190 relative to the substrate 100.

It will be appreciated from FIG. 2 that the central electrode 190 is operable to at least partially obscure the junctions 150 and thereby attenuate and scatter light radiation generated thereat. Moreover, as elucidated in the foregoing, it is desirable to apply two mutually different depleting potentials to the first and second wire segments 130, 140 so as to achieve a similar degree of band bending therein and hence a narrower spectrum of light radiation emission from the device 50. Such spectrum broadening, attenuation and scattering are susceptible to being reduced by disposing the electrode 190 as two electrodes 190a, 190b substantially adjacent to the junctions 150 but not obscuring them as illustrated in FIG. 3. The device of FIG. 3 is susceptible to having mutually different bias voltages applied to its two electrodes 190a, 190b so as to provide substantially similar energy band bending in the first and second nanowire sections 130, 140. Preferably, a separation "w" between the electrodes 190a, 190b is in a range from 0.5 to 10 times a thickness "t" of the combined thickness of the upper oxide layer 180 and the segments 130, 140 as illustrated. More preferably, the separation "w" is in a range of 1 to 3 times the thickness "t".

Figure 3:
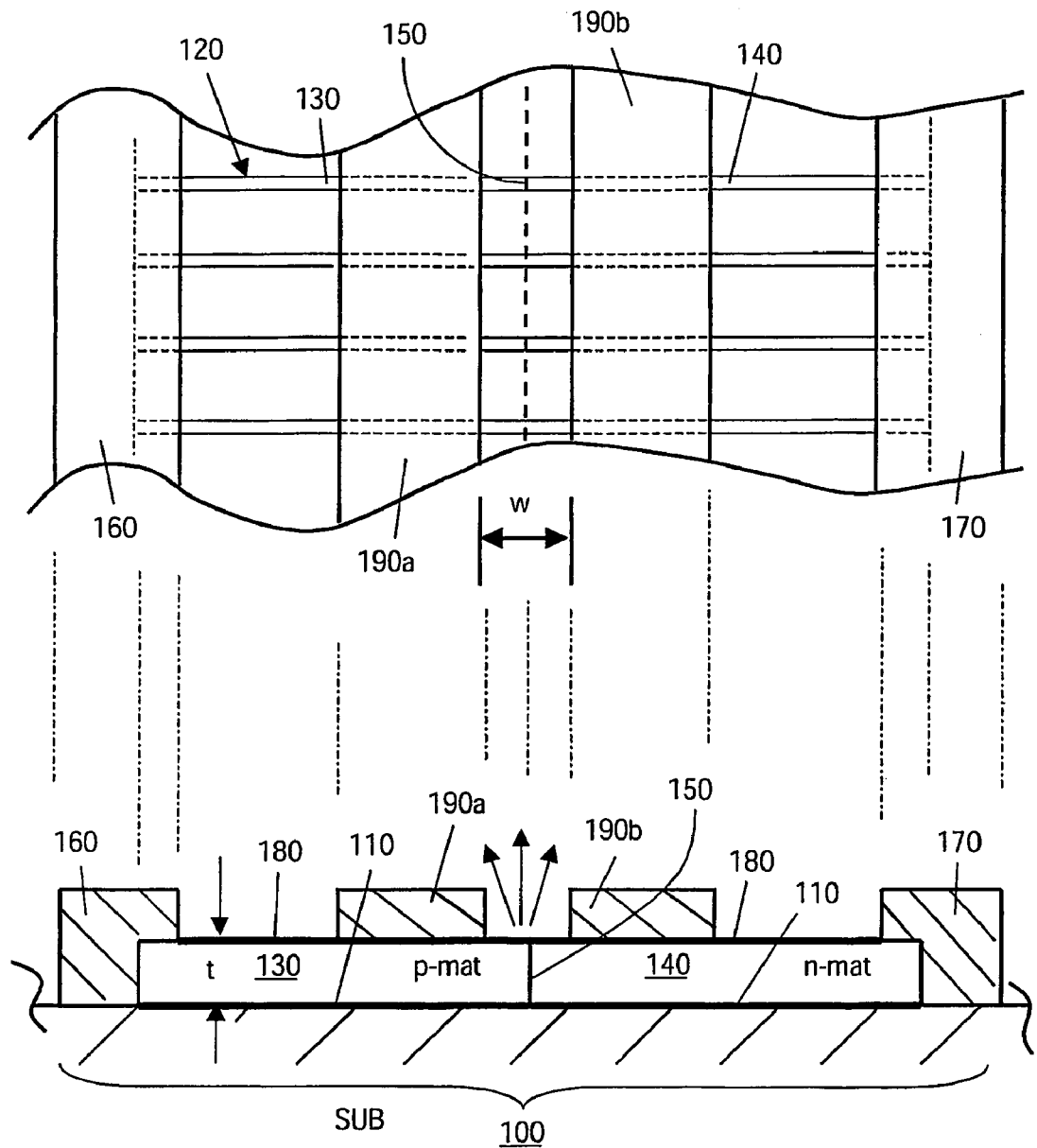
FIG. 3 is a schematic diagram of a second tunable radiation emitting semiconductor device according to the invention.
Figure 4:
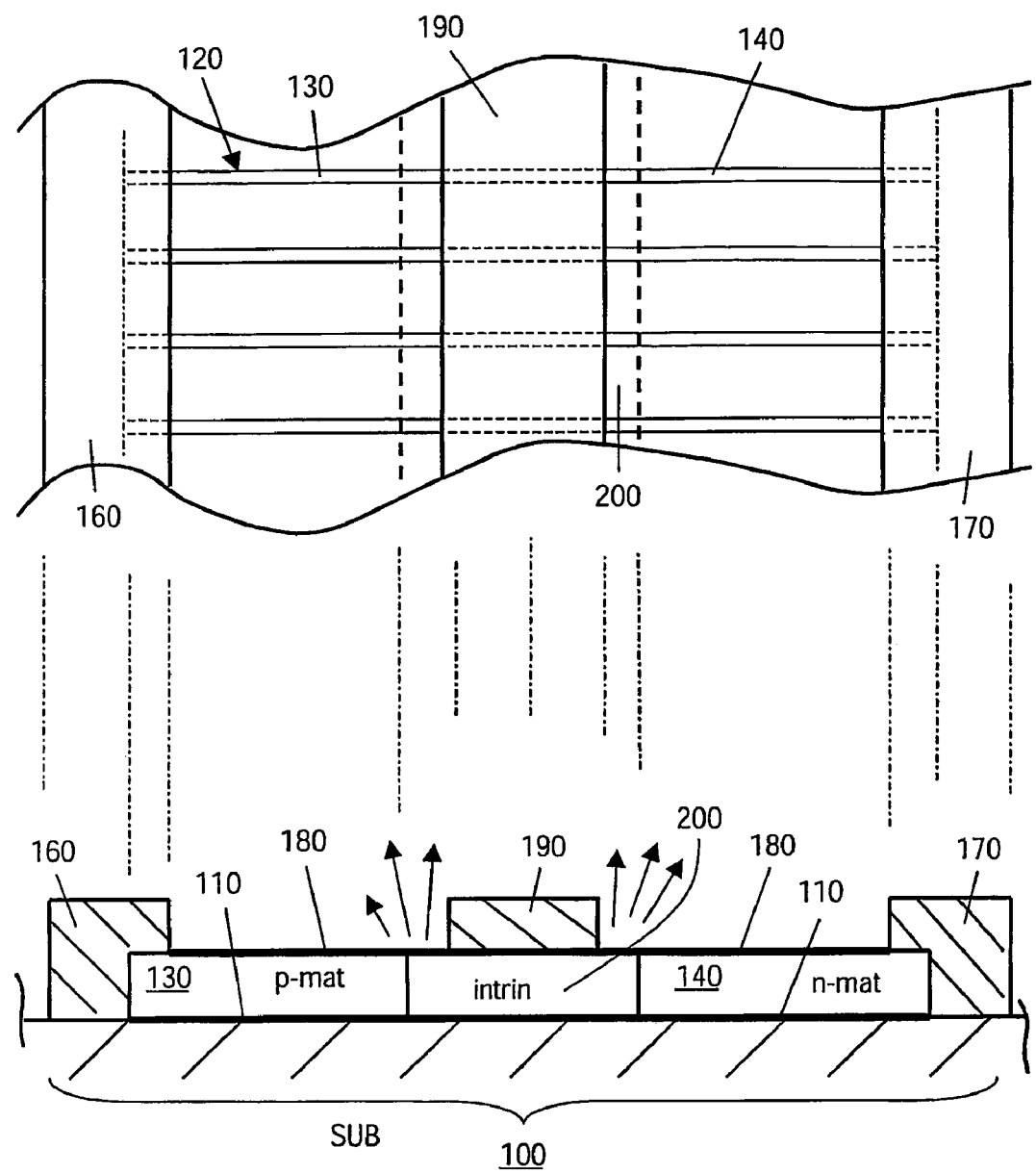
FIG. 4 is a schematic diagram of a third tunable radiation emitting semiconductor device according to the invention.

In order that the device in FIG. 3 should be capable of providing a more rapid frequency modulation of light radiation emitted from the junctions 150, the electrodes 190a, 190b are preferably not significantly extended laterally towards the end electrodes 160, 170 because the electrodes 190a, 190b are relatively ineffective at modulating light radiation in these regions where less carrier recombination occurs.

Where a single central electrode 190 is highly desirable and device manufacture is to become rendering more straightforward, the sections 130, 140 themselves are susceptible to being fabricated with an intrinsic region therebetween as illustrated in FIG. 4. In FIG. 4, the device includes an intrinsic region 200 between the first and second sections 130, 140 of each nanowire 120. Such an intrinsic region 200 effectively spatially spreads out a volume where electron recombination occur whose energies correspond to visible light photons emitted from the nanowires 120. The central electrode 190 preferably then substantially spans the intrinsic region 200 as shown. Incorporation of the intrinsic region 200 is also susceptible to increasing resistance of the nanowires 120 which is advantageous in some applications of use where voltage sources are employed to energize the device.

It will be appreciated that light radiation emission from a single nanowire 120 is insufficient for many practical LED applications where, for example, visibility to the human eye is desirable. In consequence, the devices in FIGS. 2 to 4 include a plurality of nanowires 120, for example a two-dimensional array of several rows of such nanowires 120. Flow processes as described in a publication by Huang et al. Science 291 (2001) pp. 630 and/or electrostatic assembly as described in a publication by Duan et al. Nature 409 (2001) pp. 66 are susceptible to being employed to fabricate such arrays, these two publications disclosing subject matter which is herein incorporated by reference.

Therefore, in the foregoing, a LED is described operable to emit light radiation whose wavelength is susceptible to being voltage controlled. The LED comprises an array of the nanowires 120 fabricated from a direct bandgap semiconductor material. The nanowires 120 each incorporate an internal pn-junction and an insulating oxide layer therearound. At least one gate electrode is evaporated or otherwise deposited in a region of each nanowire 120 susceptible to emitting light in operation. By applying a voltage difference to the at least one gate electrode, band bending in the nanowires 120 is achievable resulting in a modulation of charge transport and carrier recombination in regions in close proximity to the at least one electrode. On account of a dependence of emitted light radiation wavelength to diameter of active regions of the nanowires 120, a change in this wavelength is inducible in response to changes in the voltage difference.

It will be appreciated that the device 50 in FIG. 2 and variation thereof in FIGS. 3 and 4 are susceptible to being used in a wide range of electro-optical products, for example in compact disc (CD) drives, in DVD drives, in pixel displays and in wavelength division multiplexed (WDM) multi-channel optical communication systems utilizing optical fibre signal transmission.

It will be appreciated that embodiments of the invention described in the foregoing are susceptible to being modified without departing from the scope of the invention.

For example, in the foregoing, fabrication and structure of a LED operable to emit light radiation is described wherein a substantially parallel disposition of the LED's component parts relative to a major surface plane of an associated planar substrate is presented. The LED can alternatively be fabricated with its component parts disposed in a non-parallel, more preferably substantially orthogonal, orientation on a major surface of a planar substrate. It is known from a contemporary scientific publication (JAP 77(2), pp. 447, 1995) that GaAs nanowires are susceptible to being grown epitaxially in an orthogonal orientation on a major [111]-orientation crystal plane surface of a GaAs substrate. During such orthogonal epitaxial growth, p-n junctions are susceptible to being included. Moreover, a gate electrode is susceptible to being co-fabricated by embedding an array of light-emitting nanowires in a gate material. The gate material is preferably a transparent material such as indium tin oxide (ITO), although a substantially transparent organic polymer such as a polythiophene derivation (PEDOT) material can alternatively be employed. On top of such a gate material, remote form the substrate, an oxide insulating material is deposited and subsequently a top electrode connecting to the nanowires is provided to fabricate a tunable wavelength LED incorporating "vertically" grown nanowires susceptible to emitting light radiation.

The invention claimed is:

1. A tunable radiation emitting semiconductor device comprising at least one elongated structure at least partially fabricated from one or more semiconductor materials exhibiting a bandgap characteristic including one or more energy transitions whose energies correspond to photon energies of light radiation, the at least one structure thereby being operable to emit light radiation therefrom in response to a current flow therethrough, the at least one elongated structure being sufficiently narrow for quantum confinement of charge carriers associated with the current flow to occur therein, the at least one elongated structure further comprising an electrode arrangement for applying an electric field to the at least one elongated structure for causing bending of its bandgap characteristic for modulating a wavelength of the light radiation emitted in operation from the at least one structure in response to the current flow through it, wherein the at least one elongated structure comprises a plurality of regions of mutually different composition, the plurality of regions defining at least one semiconductor junction whereat carrier recombination associated with the current flow occurs in operation, said recombination operable to generate the light radiation for emission from the device.

2. The device according to claim 1, wherein the at least one elongated structure is encapsulated at least in a central region thereof in an insulating material, and the electrode arrangement is operable to cause bending of the bandgap structure of the at least one elongated structure by establishing the electric field through the insulating material.

3. The device according to claim 1, wherein the at least one elongated structure includes a substantially intrinsic semiconductor region therein interposed between a n-type region and a p-type region, the intrinsic region operable to support carrier recombination therein.

4. The device according to claim 1, wherein the electrode arrangement is arranged to cover a region where the at least one semiconductor junction is substantially located.

5. The device according to claim 1, wherein the electrode arrangement is arranged to lie adjacent to a region where the at least one semiconductor junction is substantially located.

6. The device according to claim 1, wherein for each of the at least one elongated structure the electrode arrangement provides a plurality of electrodes for differentially applying electric fields to the plurality of regions for causing mutually different energy band bending therein.

7. The device according to claim 1, wherein the electrode arrangement is disposed so as to generate an electric field substantially in a direction orthogonal to a direction of the current flow along the at least one elongated structure.

8. The device according to claim 1, wherein the at least one elongated structure has an effective nominal diameter which is in a range from 5 nm to 50 nm.

9. The device according to claim 1, wherein the at least one elongated structure has a cross-sectional aspect ratio not exceeding 1:2.

10. The device according to claim 1, wherein the at least one elongated structure is fabricated from group III-V or group II-VI compounds, or ternary or quaternary semiconductor materials.

11. The device according to claim 1, said device comprising a plurality of the elongated structures disposed as a 2-dimensional array of pixels for providing an image display.

12. A method of fabricating a tunable radiation emitting semiconductor device, the method comprising the acts of:

(a) providing a substantially planar substrate;

(b) forming a first layer of insulating material onto at least a region of the substrate;

(c) forming at least one elongated structure including at least one semiconductor junction on an exposed surface of the first layer remote from the substrate, the at least elongated one structure being sufficiently small in cross-section to provide quantum confinement of charge carriers therein and providing sites for charge carrier recombination therein, such sites exhibiting an energy band distribution corresponding to quantum energies associated with light radiation, the at least one elongated structure being capable of conducting an associated current therealong;

(d) forming a second layer of insulating material at least partially covering the at least one elongated structure; and (e) forming an electrode arrangement on an upper exposed surface of the second layer of insulating material, the electrode arrangement being so disposed as to be capable of inducing energy band bending in the at least one elongated structure when biased in operation for modulating the wavelength of the light radiation emitted therefrom;

wherein, for each of the at least one elongated structure, the electrode arrangement provides a plurality of electrodes for differentially applying electric fields to a plurality of regions of the at least one elongated structure for causing mutually different energy band bending therein.

13. The method according to claim 12, wherein the electrode arrangement is arranged to cover a region where the at least one semiconductor junction is substantially located.

14. The method according to claim 12, wherein the electrode arrangement is arranged to lie adjacent to a region where the at least one semiconductor junction is substantially located.

15. A tunable radiation emitting semiconductor device comprising:

an elongated structure at least partially fabricated from one or more semiconductor materials and being operable to emit light radiation therefrom in response to a current flow therethrough, the elongated structure being sufficiently narrow for quantum confinement of charge carriers associated with the current flow to occur therein; and an electrode arrangement for applying an electric field to the elongated structure for causing bending of bandgap characteristic of the semiconductor materials for modulating a wavelength of the light radiation emitted in operation from the structure in response to the current flow;

wherein the elongated structure comprises regions of mutually different composition, the regions defining at least one semiconductor junction whereat carrier recombination associated with the current flow occurs in operation, said recombination being operable to generate the light radiation.

16. The tunable radiation emitting semiconductor device of claim 15, wherein the regions of mutually different composition are separated by an intrinsic region that increases a resistance of the elongated structure.

17. The tunable radiation emitting semiconductor device of claim 16, wherein the electrode arrangement includes a central electrode that substantially spans the intrinsic region.

18. The tunable radiation emitting semiconductor device of claim 15, wherein the electrode arrangement includes a central electrode that overlap with the at least one semiconductor junction.

19. The tunable radiation emitting semiconductor device of claim 15, wherein the electrode arrangement includes two electrodes that are substantially adjacent to the at least one semiconductor junction.

20. The tunable radiation emitting semiconductor device of claim 19, wherein different bias voltages are applied to the two electrodes so as to provide substantially similar energy band bending in the regions of mutually different composition.

21. The tunable radiation emitting semiconductor device of claim 19, wherein a separation between the two electrodes is substantially in a range of 1 to 3 times a combined thickness of the elongated structure and an oxide layer formed over the elongated structure.

* * * * *